(12) United States Patent
Chen et al.

(10) Patent No.: US 9,184,735 B1
(45) Date of Patent: Nov. 10, 2015

(54) HIGH-VOLTAGE INPUT RECEIVER USING LOW-VOLTAGE DEVICES

(71) Applicant: QUALCOMM Incorporated, San Diego, CA (US)

(72) Inventors: Wilson Jianbo Chen, San Diego, CA (US); Chiew-Guan Tan, San Diego, CA (US); Reza Jalilizeinali, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

(21) Appl. No.: 14/254,706

(22) Filed: Apr. 16, 2014

(51) Int. Cl.
*H03K 5/08* (2006.01)

(52) U.S. Cl.
CPC ..................................... *H03K 5/08* (2013.01)

(58) Field of Classification Search
USPC ................. 327/306, 309, 327–328, 333, 112; 326/80–85
See application file for complete search history.

(56) References Cited

U.S. PATENT DOCUMENTS

| | | | |
|---|---|---|---|
| 5,966,026 A * | 10/1999 | Partovi et al. | 326/27 |
| 6,525,607 B1 | 2/2003 | Liu | |
| 6,577,163 B1 * | 6/2003 | Waldrip et al. | 326/81 |
| 6,819,137 B1 | 11/2004 | Wang et al. | |
| 6,879,198 B2 | 4/2005 | Kumar et al. | |
| 8,482,329 B2 | 7/2013 | Deshpande et al. | |
| 2004/0075468 A1 | 4/2004 | Haskin | |

FOREIGN PATENT DOCUMENTS

| | | |
|---|---|---|
| EP | 0450406 A2 | 10/1991 |
| JP | S55165006 A | 12/1980 |
| JP | H08265065 A | 10/1996 |

OTHER PUBLICATIONS

Partial International Search Report—PCT/US2015/019958—ISA/EPO—Jun. 29, 2015.

* cited by examiner

*Primary Examiner* — An Luu
(74) *Attorney, Agent, or Firm* — Haynes and Boone, LLP

(57) ABSTRACT

An input receiver for stepping down a high-voltage domain input signal into a low-voltage-domain stepped-down signal includes a waveform chopper. The waveform chopper chops the high-voltage domain input signal into a first chopped signal and a second chopped signal. A high-voltage-domain receiver combines the first chopped signal and the second chopped signal into a high-voltage-domain combined signal. A step-down device converts the high-voltage-domain combined signal into a stepped-down low-voltage-domain signal.

20 Claims, 6 Drawing Sheets

HIGH-VOLTAGE INPUT RECEIVER USING LOW-VOLTAGE DEVICES

TECHNICAL FIELD

This application relates to receivers, and more particularly for a receiver that converts a high-voltage-domain input signal into a received low-voltage-domain signal.

BACKGROUND

As semiconductor technology has advanced into the deep submicron regime, the power supply voltage is scaled down in concert with the scaling down of transistor dimensions. Nevertheless, input/output (I/O) standards from higher-voltage regimes may still need to be supported. But the thick-oxide transistors in modern high-density integrated circuits may not be able to accommodate any voltage higher than some maximum level such as two volts across their gate-source, gate-drain, or source-drain junctions. To safely receive input signals with voltages that exceed such maximum levels, it is conventional to use native transistors in the integrated circuit's input receiver.

An example conventional input receiver 100 is shown in FIG. 1A. A native NMOS pass transistor 105 has its gate driven by the internal power supply voltage VDD. This internal voltage VDD is lower than a power supply voltage VDDX that is cycled to by a VDDX-domain input signal 102 received at a drain of native pass transistor 105. The level for VDDX depends upon the signaling protocol for input signal 102. For example, one signaling protocol may have input signal 102 cycle between 0 and 3.3V (VDDX) according to its frequency. In contrast, VDD may equal 1.8V or 1.65 V, which is a safer level for modern devices. In that regard, if 3.3V were impressed across any pair of terminals for native pass transistor 105 (drain-to-source, gate-to-source, or gate-to-drain), native pass transistor 105 may fail. More generally, VDD equals approximately one-half of VDDX, regardless of the level for VDDX as determined by the signaling protocol.

As input signal 102 rises to VDD, it passes through to the drain of native pass transistor 105 since its voltage threshold is zero volts. The gate-to-source voltage for native pass transistor 105 eventually drops to zero, which prevents the source of native pass transistor from rising higher than VDD. Although the drain continues to rise to 3.3V in a cycle of input signal voltage 102, native pass transistor 105 is not strained since there is no more than a VDD voltage difference between its drain and source. Similarly, there is never more than a VDD voltage difference between the gate and drain or between the gate and source of native pass transistor 105.

A receiver such as an inverter 110 powered by the VDD power supply voltage inverts the source voltage to produce a VDD-domain or stepped-down output signal 115 from VDDX-domain input signal 102. Inverter 110 drives output signal 115 to internal circuitry (not illustrated) of the integrated circuit that includes input receiver 100. Although native pass transistor 105 avoids voltage strain problems in converting VDDX-domain input signal 102 into a VDD-domain output signal 115, input receiver 100 suffers from a number of problems. For example, an external source drives input signal 102. Input receiver 100 has no control over this external source. Native pass transistor 105 thus passes whatever duty cycle and slew rate it receives through to inverter 110. The duty cycle and slew rate for VDD-domain output signal 115 from inverter 110 may thus be unacceptably distorted. In addition, further distortion results from input signal 102 oscillating between voltage minimums and voltage maximums that differ from the desired levels of ground and VDDX. Moreover, native devices such as native pass transistor 105 are very sensitive to process variations. Use of input receiver 100 is thus limited to relatively low input signal frequencies such as in the tens of MHz to satisfy a +/−5% duty cycle error requirement.

Accordingly, there is a need in the art for step-down input receivers providing more accurate performance in higher frequency domains.

SUMMARY

An input receiver is provided that includes a waveform chopper for receiving an input signal. The waveform chopper chops the input signal into a first chopped signal and a second shopped signal with regard to a threshold voltage such as an internal power supply voltage VDD. The waveform chopper passes the input signal to drive the first chopped signal when the input signal cycles above VDD. However, the waveform chopper clamps the first chopped signal at VDD when the input signal cycles below VDD. Similarly, the waveform chopper passes the input signal to drive the second chopped signal when the input signal cycles below VDD but clamps the second chopped signal at VDD when the input signal cycles above VDD.

A VDDX-domain receiver combines the chopped signals into a VDDX-domain combined signal. VDDX is a power supply voltage of approximately twice VDD. The VDDX-domain receiver charges the combined signal to VDDX when the first chopped signal is clamped at VDD. Conversely, the VDDX-domain receiver discharges the combined signal to ground when the second chopped signal is clamped at VDD.

BRIEF DESCRIPTION OF THE DRAWINGS

Embodiments of the disclosed input receiver and their advantages are best understood by referring to the detailed description that follows. It should be appreciated that like reference numerals are used to identify like elements illustrated in one or more of the figures.

DETAILED DESCRIPTION

Figure 2:
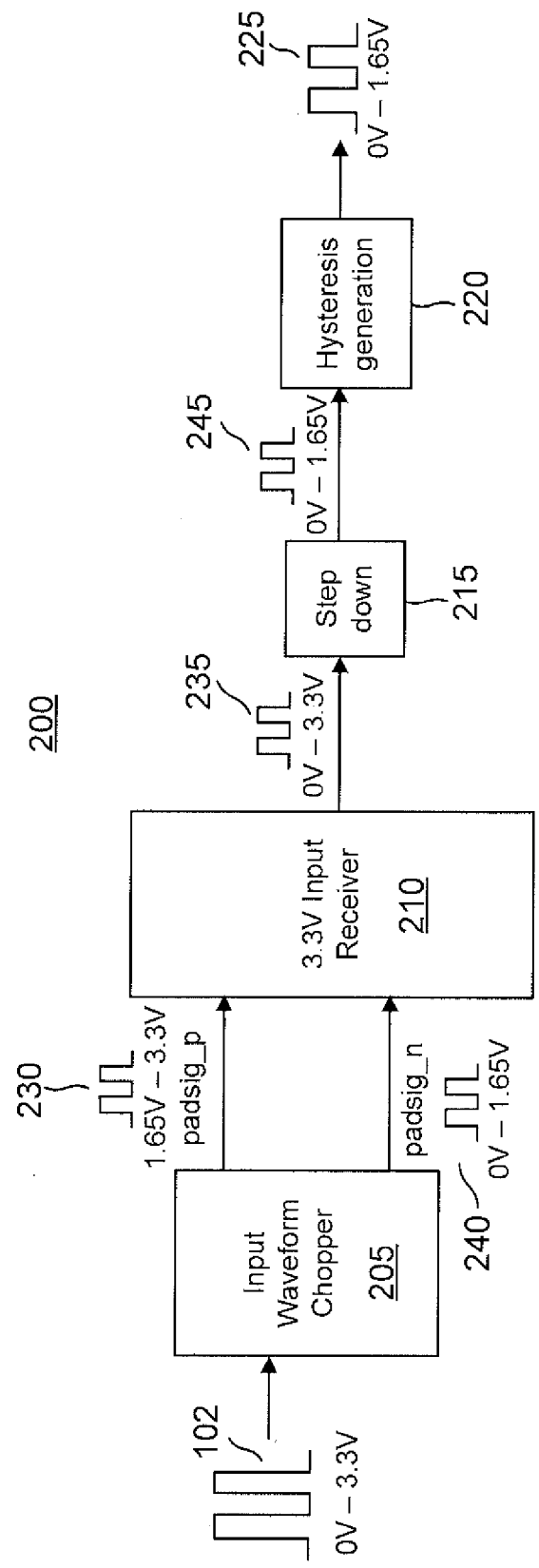
FIG. 2 is a block diagram of an input receiver for converting a high-voltage-domain input signal into a received low-voltage-domain signal having an improved slew rate, duty cycle, minimum and maximum voltage levels, and high-frequency performance in accordance with an embodiment of the disclosure.

An input receiver 200 illustrated in FIG. 2 steps down a high-voltage-domain (VDDX) input signal 102 into a reduced-voltage-domain (VDD) output signal 225 with improved duty cycle, slew rate, and voltage minimum and maximum levels. To do so, input receiver 200 receives VDDX-domain input signal 102 at a waveform chopper 205.

Figure 1:
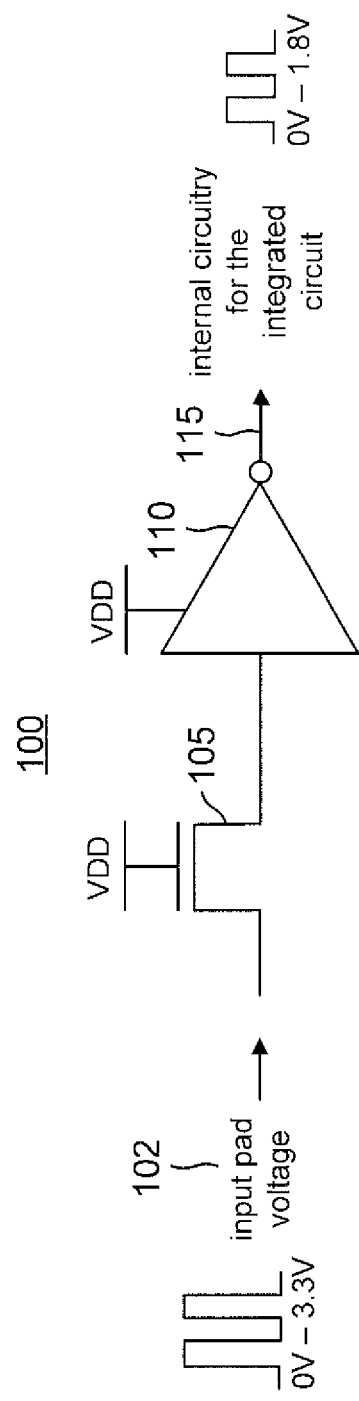
FIG. 1 is a circuit diagram of a conventional input receiver for converting a high-voltage-domain input signal into a received low-voltage-domain signal.

In contrast, conventional receiver 100 discussed with regard to FIG. 1 receives input signal 102 at native pass transistor 105. Input signal 102 is intended to cycle between 0 volts and the high-voltage-domain supply voltage VDDX although it may be off from these minimum and maximum voltage levels due to inaccuracies in the input signal source (not illustrated). In that regard, input receiver 200 has no control over the quality of input signal 102 with regard to its slew rate, duty cycle, and maximum and minimum voltage levels since the external source (not illustrated) generates input signal 102 and drives it to the die (not illustrated) that includes input receiver 200. Waveform chopper 205 chops input signal 102 with regard to a threshold voltage such as an internal power supply voltage VDD that equals approximately VDDX/2. For example, in one embodiment VDDX may equal 3.3 V whereas VDD may equal 1.8 V or 1.65 V. The VDD voltage level is low enough such that low-voltage domain devices (not illustrated) downstream from input receiver 200 are not damaged by it. For example, the die containing input receiver 200 may include both thick-gate-oxide devices as well as thin-gate-oxide devices. The thick-gate-oxide devices are robust to the relatively high level for VDD such as 1.8V. In contrast, the thin-gate oxide devices are not robust to such voltage levels but instead can withstand only reduced voltage levels such as 1 V or lower.

The devices in input receiver 200 may comprise thick-gate-oxide devices so that they are robust to VDD voltage levels. However, these devices are not robust to VDDX voltage differences. Although input receiver receives VDDX-domain input signal 102, the design of input receiver 200 ensures that each device in input receiver 200 never has an unsafe voltage level (e.g., VDDX) across any of its terminals (gate-to-source, gate-to-drain, and drain-to-sources) as will be explained further herein.

Waveform chopper 205 produces two chopped signals: a first chopped signal (padsig_p) 230 that cycles between VDD and VDDX, and a second chopped signal (padsig_n) 240 that cycles between 0 V and VDD. Waveform chopper 205 forms first and second chopped signals padsig_p 230 and padsig_n 240 with regard to, for example, VDD. More generally, VDD is representative of a threshold voltage for the chopping performed by waveform chopper 205. In that regard, note again that input signal 102 cycles (ideally) between 0 V and VDDX. Each cycle of input signal 102 will thus include a lower-half cycle in which input signal 102 cycles between ground and VDD and an upper-half cycle in which input signal 102 cycles between VDD and VDDX. Waveform chopper 205 substantially passes each upper-half cycle of input signal 102 as first chopped signal padsig_p 230. But waveform chopper 205 clamps first chopped signal padsig_p 230 at VDD when input signal 102 drops below VDD in its lower-half cycles. Each cycle of first chopped signal padsig_p 230 will thus include a clamped half-cycle and a non-clamped half-cycle. The clamped half-cycles correspond to the lower-half cycles for input signal 102. The non-clamped half-cycles correspond to the upper-half cycles for input signal 102. In the clamped half-cycles, first chopped signal padsig_p 230 is clamped at VDD during that portion of the lower-half cycle for input signal 102 when it drops below VDD. In the remaining portions of the clamped half-cycles, first chopped signal padsig_p 230 substantially equals input signal 102 as it rises from VDD or falls toward VDD. Similarly, in the non-clamped half-cycles, first chopped signal padsig_p 230 substantially equals input signal 102 as it rises and falls between VDD and VDDX in its upper-half cycles.

Similarly, waveform chopper 205 substantially passes each lower-half cycle of input signal 102 as a non-clamped half cycle of second chopped signal padsig_n 240. However, waveform chopper 205 clamps second chopped signal padsig_n 240 at VDD when input signal 102 rises above VDD in its upper-half cycles. The upper-half cycles for input signal 102 thus correspond to the clamped half cycles for second chopped input signal padsig_n 240. As discussed above, input receiver 200 has no control over the quality of input signal 102. So the upper-half cycles for input signal 102 may not reach the desired or intended voltage level of VDDX. Similarly, the lower-half cycles for input signal 102 may not reach 0 V or ground (VSS). Nevertheless, one can be reasonably confident that input signal 102 is above VDD for a majority of the time in each upper-half cycle. First chopped signal padsig_p 230 will thus be clamped at VDD for most (or at least an appreciable portion) of each of its clamped half cycles. Similarly, one can be reasonably confident that input signal 102 is below VDD for a majority of the time in each lower-half cycle. Second chopped signal padsig_n 240 will thus be clamped at VDD for most (or at least an appreciable portion) of each of its clamped half cycles.

One can therefore appreciate that a "combined" signal that cycles between 0 V and VDDX may be advantageously reconstructed from the clamped half cycles for first and second chopped signals padsig_p 230 and padsig_n 240. For example, suppose that such a combined signal was driven to VDDX whenever first chopped signal padsig_p 230 is clamped at VDD. Similarly, suppose that the combined signal was grounded whenever second chopped signal padsig_n 240 is clamped at VDD. Since first chopped signal padsig_p is clamped at VDD as input signal 102 drops from VDD to ground whereas second chopped signal padsig_n 240 is clamped at VDD as input signal 102 rises from VDD to VDDX, the resulting combined signal is inverted or 180 degrees out of phase with input signal 102. Generating a combined signal in this fashion is quite advantageous because the combined signal will then have the desired minimum and maximum voltage levels. In contrast, these minimum and maximum voltage levels cannot be guaranteed for input signal 102. Moreover, because the clamped VDD levels occur for most of (or at least an appreciable portion of) each clamped half cycle for first and second chopped signals padsig_p 230 and padsig_n 240, the resulting combined signal would then have a desirable duty factor and slew rate. In contrast, the duty cycle and slew rates for input signal 102 have no such guarantee of a desirable duty factor, slew rate, or maximum and minimum voltage levels.

Referring again to FIG. 2, a VDDX-domain chopped waveform receiver 210 processes the first and second chopped signals padsig_p 230 and padsig_n 240 to produce a combined signal 235 that cycles as just described to achieve these advantages. The result is that input signal 102, which ideally cycles between 0 and VDDX, is processed to produce combined signal 235 that also cycles between 0 and VDDX. But note that input signal 102 is not merely reproduced to form combined signal 235. Instead, the combination of waveform chopper 205 and VDDX-domain chopped waveform receiver 210 improves the slew rate, duty cycle, and enforces the desired minimum and maximum voltage levels for combined signal 235 as discussed above.

Given these improvements in slew rate, duty cycle, and the signal voltage minimum and maximum levels, a step-down device 215 such as a native pass transistor may then be used to form a VDD-domain output signal 245 from combined signal 235. As discussed analogously with regard to native pass transistor 105 of FIG. 1, step-down device 215 may comprises an NMOS native pass transistor (not illustrated) that receives VDDX-domain combined signal 235 at one drain/source terminal to pass a VDD-domain output signal 245 at its remaining drain/source terminal as controlled by VDD being applied to its gate. There is no voltage threshold loss in a native transistor so VDD-domain output signal 245 may saturate at VDD (as opposed to VDD minus some threshold voltage) when combined signal 235 cycles above VDD.

In some embodiments, a hysteresis circuit 220 such as a Schmitt trigger may further process VDD-domain output signal 245 to form a final VDD-domain output signal 225 as discussed further herein. Alternatively, VDD-domain output signal 245 may be used as an output signal without any hysteresis treatment.

Because of the slew rate and duty cycle adjustment and the enforcement of the desired voltage maximum and minimum levels by the combination of waveform chopper 205 and VDDX-domain chopped waveform receiver 210, input signal 102 may have a relatively high frequency such as hundreds of MHz or higher yet it may be stepped down from the VDDX domain to the VDD domain without loss of fidelity. These advantageous features may be better appreciated with reference to the following example embodiments.

Figure 3:
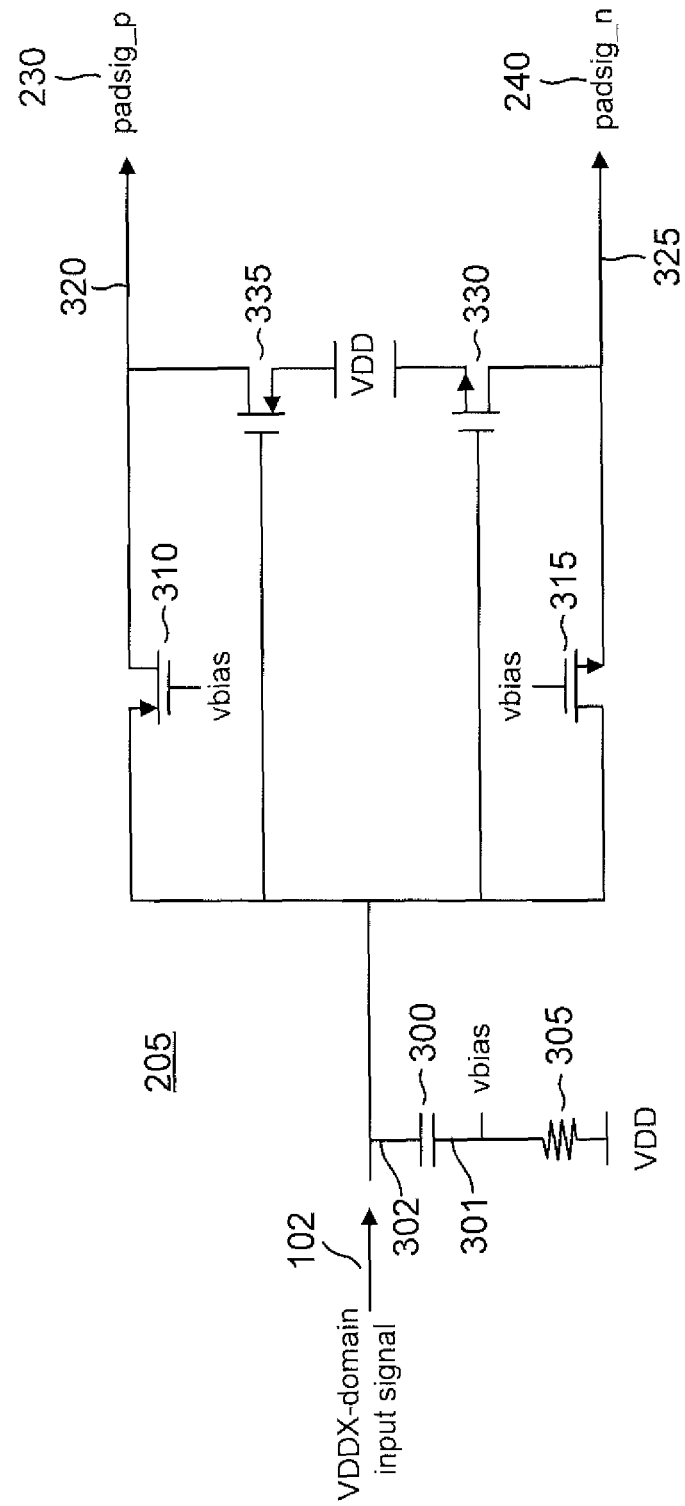
FIG. 3 is a circuit diagram of the waveform chopper in the input receiver of FIG. 2.

A circuit diagram for an example waveform chopper 205 is shown in FIG. 3. A voltage divider formed by a capacitor 300 in series with a resistor 305 receives input signal 102 at a first terminal 302 of capacitor 300. Resistor 305 couples between a power supply node supplying the internal power supply voltage VDD and a remaining second terminal 301 for capacitor 300. Should input signal 102 be grounded, a voltage (designated as Vbias) for second terminal 301 will thus settle to VDD. As input signal 102 rises to VDD, Vbias will rise slightly higher than VDD but to a level lower than VDDX before settling again to VDD as input signal 102 continues to rise to VDDX. The actual amount of voltage increase over VDD for Vbias depends upon the voltage division as determined by the resistance of resistor 305 and capacitance of capacitor 300. Conversely, as input signal 102 falls from VDDX to VDD, Vbias will be pulled temporarily lower than VDD before again settling to its default level of VDD as input signal continues to cycle towards ground and then back towards VDD.

These temporary increases and decreases of Vbias with respect to its default level of VDD are advantageous because Vbias biases the gates of a PMOS pass transistor 310 and an NMOS pass transistor 315 in waveform chopper 205. The drain/source terminals for PMOS pass transistor 310 couple between first terminal 302 of capacitor 300 and an output node 320 for carrying first chopped signal padsig_p 230. Similarly, the drain/source terminals for NMOS pass transistor 315 couple between first terminal 302 and an output node 325 for carrying second chopped signal padsig_n 240. The operation of NMOS pass transistor 315 will be discussed first.

As input signal 102 rises from 0 V to VDD, Vbias will jump slightly higher than VDD as discussed above. This rise in the gate voltage on NMOS pass transistor 315 assists it to pass as much as possible of the rising edge of input signal 102 through to second chopped signal padsig_n 240. But note that NMOS pass transistor 315 is not a native transistor. This is advantageous in that process variations for second chopped signal padsig_n 240 are reduced but at the cost of a threshold voltage loss in the rising edge of second chopped signal padsig_n 240 in comparison to the rising edge of input signal 102. This threshold voltage loss is reduced by having Vbias drive the gate of NMOS pass transistor 315 as opposed to simply biasing this gate with VDD. In addition, an NMOS clamping transistor 330 has a source coupled to output node 325 and a drain coupled to a power supply node providing VDD. The gate of NMOS clamping transistor 330 is driven by the input signal 102. Although clamping NMOS transistor 330 is also a non-native transistor, its gate voltage will rise toward VDDX as input signal 102 rises to VDDX. Thus, even with a threshold voltage loss, clamping NMOS transistor 330 may readily clamp second chopped signal padsig_n 240 at VDD as input signal 102 rises above VDD towards VDDX.

Operation of PMOS pass transistor 310 is analogous. As input signal 102 rises to VDDX, Vbias on the gate of PMOS pass transistor 310 becomes a virtual ground since Vbias will settle to VDD. As known in the PMOS arts, PMOS transistors pass a strong logic 1. Thus PMOS pass transistor 310 has no issue with regard to passing the rising edge of input signal 102 through to first chopped signal padsig_p 230 as input signal 102 rises from VDD to VDDX. However, PMOS transistors in general will pass a weak logic 0. To mitigate a resulting distortion on passing the falling edge of input signal 102 as it falls from VDDX to VDD, Vbias is temporarily pulled below VDD due to the effect of capacitor 300 as input signal 102 falls from VDDX to VDD. In this fashion, PMOS pass transistor 310 may pass more of the falling edge for input signal 102 through to first chopped signal padsig_p 230 as input signal 102 drops to VDD. In addition, a clamping PMOS transistor 335 has a source coupled to output node 320 and a remaining drain to a power supply node carrying VDD. The gate of clamping PMOS transistor 335 is driven by input signal 102. Clamping PMOS transistor 335 will thus be switched on while input signal 102 drops below VDD to clamp second chopped signal padsig_p 230 at VDD.

Transistors 310, 315, 330, and 335 may all comprise thick-gate-oxide transistors such that they are robust to VDD-level voltage differences across their terminals. The biasing of the gates of pass transistors 310 and 315 with Vbias protects these transistors as input signal 102 rises to VDDX. Similarly, the biasing for both the source of clamping transistor 335 and the drain of clamping transistor 330 to VDD protects the clamping transistors as input signal 102 rises to VDDX.

Figure 4:
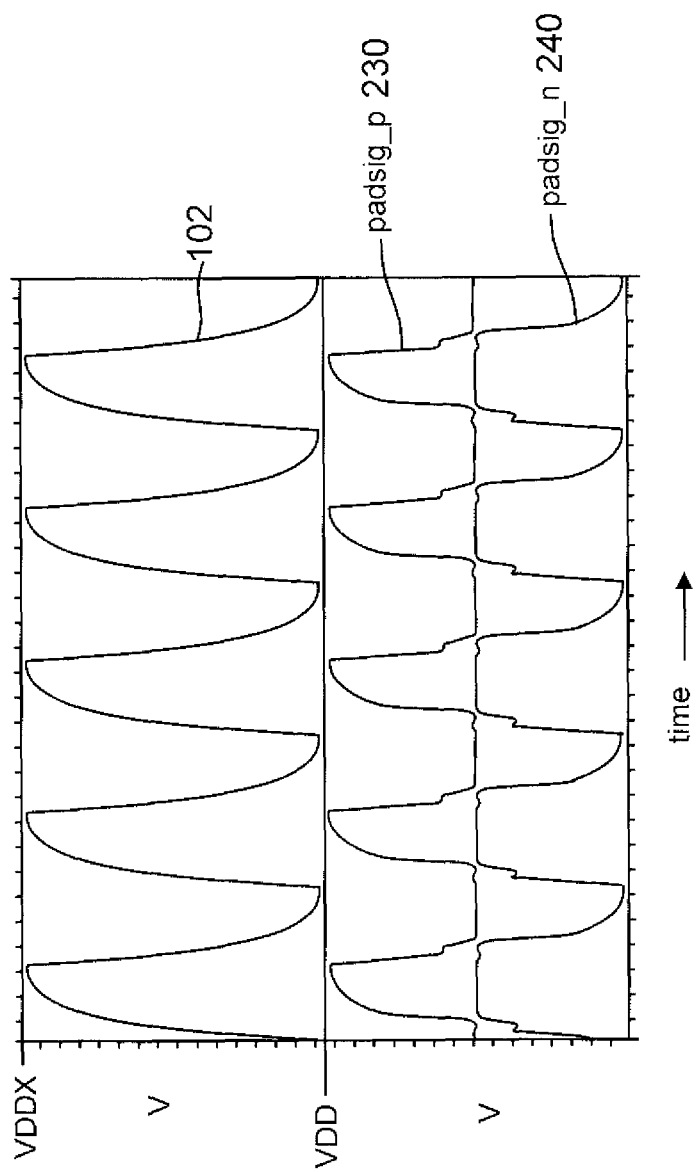
FIG. 4 is a timing diagram for the input signal and the corresponding first chopped signal and second chopped signal for the waveform chopper of FIG. 3.

An example waveform for input signal 102 is shown in FIG. 4 along with waveforms for corresponding first and second chopped signals padsig_p 230 and padsig_n 240. Second chopped signal padsig_n 240 is clamped at VDD for most of each upper-half cycle of input signal 102 as input signal 102 rises above VDD. Similarly, first chopped signal padsig_p 230 is clamped at VDD for most of each lower-half cycle for input signal 102 as input signal 102 falls below VDD. One can thus appreciate that the clamped half cycles in which first chopped signal padsig_p 230 is clamped at VDD and the clamped half cycles in which second chopped signal padsig_n 240 is clamped at VDD have relatively attractive duty cycles. As will be explained below, chopped waveform receiver 210 advantageously combines the clamped half cycles—in other words, while first chopped signal padsig_p 230 is at its VDD clamped level, combined signal 235 is driven to a logical one level (VDDX) whereas combined signal 235 is discharged to a logical zero level (VSS) while second chopped signal padsig_n 240 is clamped at VDD. The "good" half-cycles in chopped signals padsig_p 230 and padsig_n 240 are retained (the clamped half cycles) whereas their "bad" half-cycles are discarded (the non-clamped half cycles). In this fashion, the problems discussed earlier with regard to the prior art are conquered—input signal 102 may have an undesirable slew rate and minimum/maximum levels yet it is processed into combined signal 235 having the desired minimum level (VSS or ground), the desired maximum level (VDDX or 2*VDD), a desirable slew rate, and a desirable duty cycle.

Figure 5:
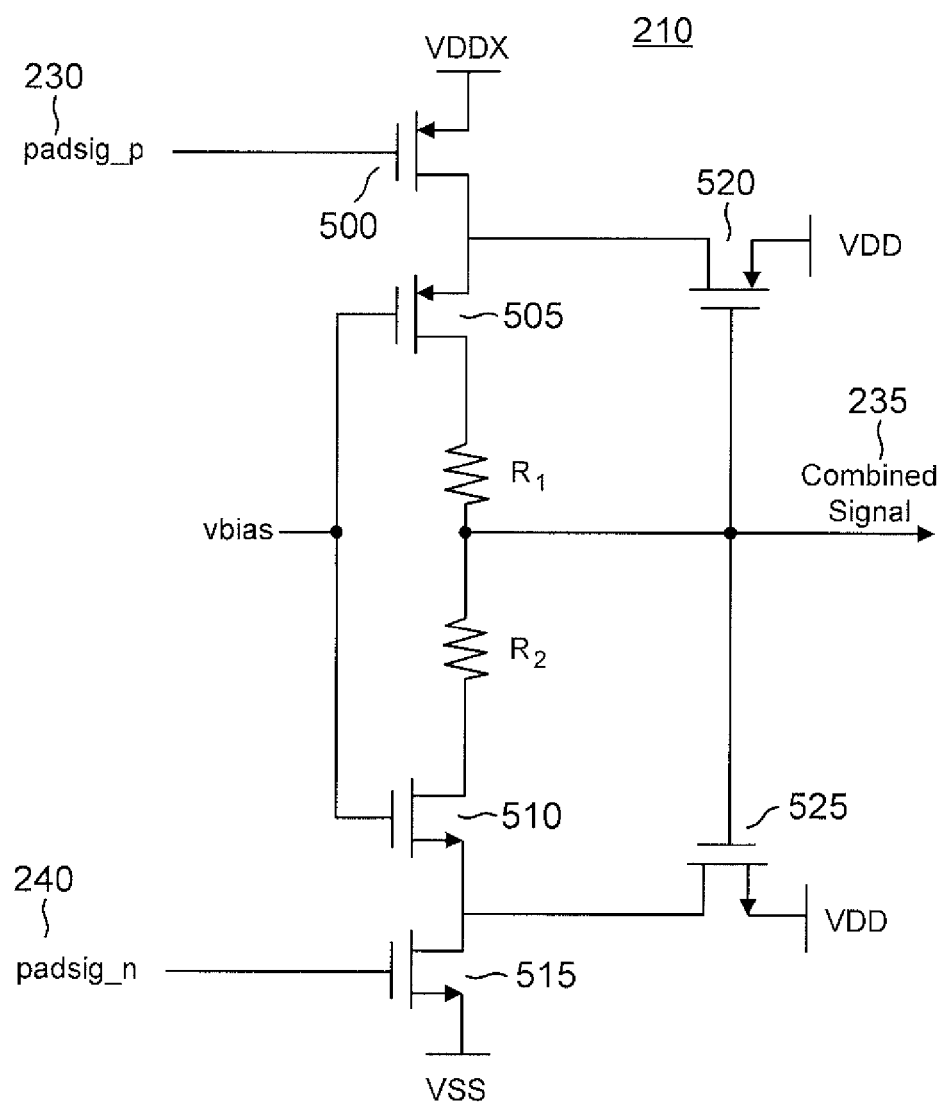
FIG. 5 is a circuit diagram of the chopped waveform receiver in the input receiver of FIG. 2.

An example chopped waveform receiver 210 is shown in FIG. 5. First chopped signal padsig_p 230 controls a first switch such as a PMOS transistor 500. The source of PMOS transistor 500 is tied to a power supply node for providing VDDX whereas its gate is driven by first chopped signal padsig_p 230. The clamped level of VDD for first chopped signal padsig_p 230 thus acts as a virtual ground for PMOS transistor 500 and switches this transistor fully on so that it charges its drain to VDDX when first chopped signal padsig_p 230 is clamped at VDD. A PMOS transistor 505 couples between the drain of PMOS transistor 500 and a resistor R1. The bias signal Vbias drives the gate of PMOS transistor 505 so that PMOS transistor 505 is also fully on when first chopped signal padsig_p 230 clamps at VDD.

Second chopped signal padsig_n 240 controls a second switch such an NMOS transistor 515. The source of NMOS transistor 515 is tied to ground and its gate driven by second chopped signal padsig_n 240. As shown in FIG. 4, second chopped signal padsig_n 240 cycles down to VSS while first chopped signal padsig_p 230 is clamped at VDD. Thus, when PMOS transistor 500 is switched on, NMOS transistor 515 is switched off. The drain of NMOS transistor 515 couples to a source of another NMOS transistor 510 having a gate driven by Vbias. Thus, NMOS transistor 510 will also be off when NMOS transistor 515 is off. The drain of NMOS transistor 510 couples to a resistor R2 in series with resistor R1. Output signal 235 is driven from a node between resistors R1 and R2. In general, downstream devices (not illustrated) that process combined signal 235 have a high input impedance such that relatively little current ever flows through resistors R1 or R2. The result is that when PMOS transistors 500 and 505 are switched on and transistor 515 switched off, combined signal 235 is driven to VDDX since there is effectively no resistive voltage drop across resistor R1.

When second chopped signal padsig_n 240 is clamped at VDD, both NMOS transistors 510 and 515 are switched on whereas PMOS transistors 505 and 500 are off. Combined signal 235 is thus discharged to ground in response to chopped signal padsig_n 240 being clamped at VDD. A PMOS transistor 520 couples between a power supply node providing VDD and the drain of PMOS transistor 500. PMOS transistor 520 is thus driven on when second chopped signal padsig_n 240 is clamped at VDD (which discharges combined signal 235) to protect PMOS transistor 500 from unsafe voltage levels. In that regard, PMOS transistor 500 has its source tied to VDDX and thus cannot have zero volts at its drain or it would be damaged. PMOS transistor 520 prevents the drain of PMOS transistor 505 from falling below VDD. Similarly, an NMOS transistor 525 has its source coupled to a power supply node providing VDD and its drain coupled to the drain of NMOS transistor 515. When first chopped signal padsig_p 230 is clamped at VDD, NMOS transistor 525 is switched on to charge the source of NMOS transistor 510 to VDD. In this fashion, NMOS transistor 510 is protected from excessive voltage levels since its drain is charged to VDDX at that time.

In one embodiment, chopped waveform receiver 210 may be deemed to comprise a means for combining first chopped signal padsig_p 230 and the second chopped signal padsig_p 240 into combined signal 235 that is charged to VDDX when first chopped signal padsig_p 230 equals VDD and that is grounded when second chopped signal padsig_n 240 equals VDD.

Optional hysteresis generator 220 may comprise a Schmitt trigger or other suitable device. The resulting hysteresis is beneficial to alleviate the "shoulders" shown in FIG. 4 for first and second chopped signals padsig_p 230 and padsig_n 240 as these signals approach their clamped levels of VDD. These irregularities in voltage occur due to pass transistors 310 and 315 being non-native and thus having non-zero threshold voltages. Hysteresis generator 220 has a high voltage threshold that input signal 102 must cross for final output signal 225 to be driven high to VDD. This high voltage threshold may be higher than VDD so that hysteresis generator 220 is not influenced by the irregularity in first chopped signal padsig_p 230 as first chopped signal padsig_p 230 falls towards VDD. Similarly, hysteresis generator 220 may have a low voltage threshold that is lower than VDD so that hysteresis generator 220 is not influenced by the irregularity in second chopped signal padsig_n 240 as second chopped signal padsig_n 240 rises to VDD. In this fashion, the duty cycle for final output signal 225 may be improved.

Figure 6:
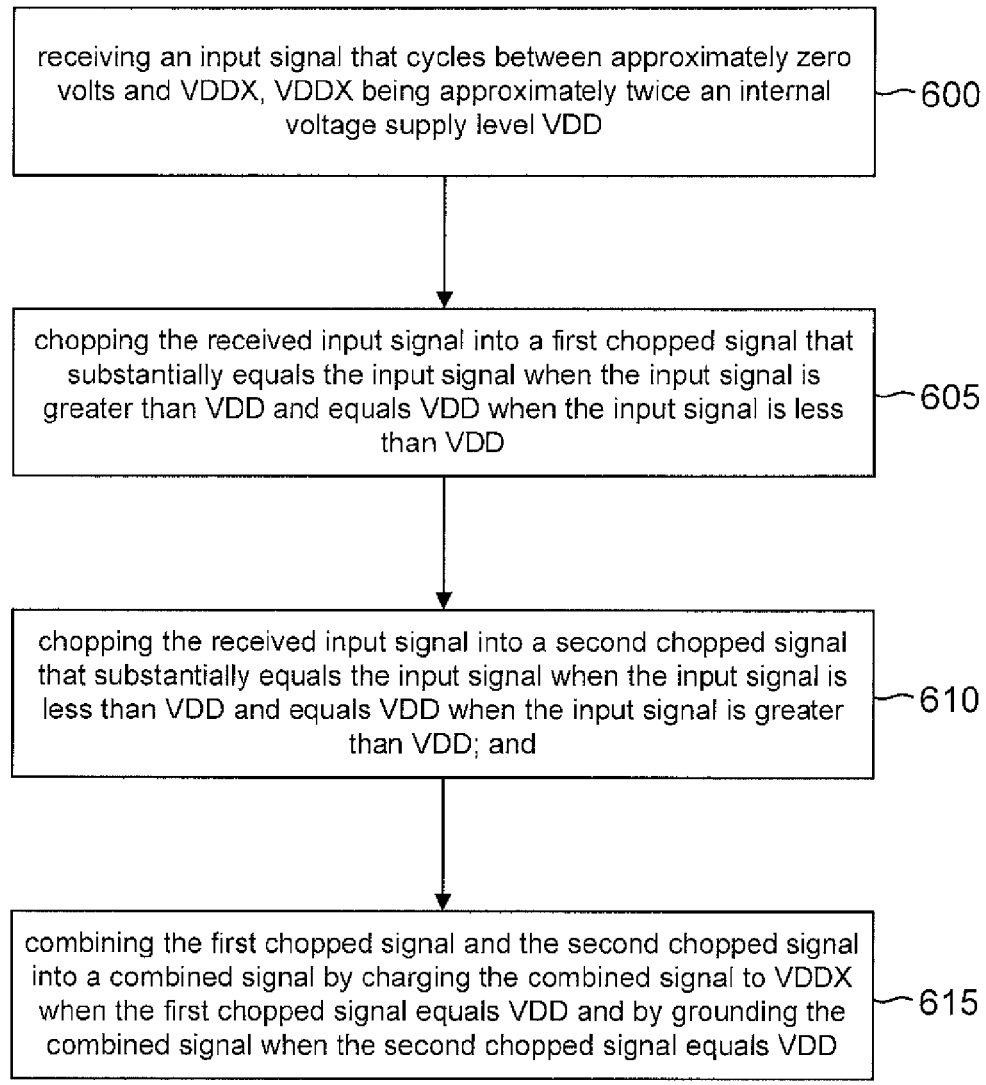
FIG. 6 is a flowchart for an example method of use for the input receiver of FIG. 2.

FIG. 6 is a flowchart for an example method of operation for an input receiver in accordance with an embodiment of the disclosure. The method begins with a step 600 of receiving an input signal that cycles between approximately ground and VDDX, VDDX being approximately twice an internal power supply voltage VDD. A step 605 comprises chopping the input signal into a first chopped signal that substantially equals the input signal when the input signal is greater than VDD and equals VDD when the input signal is less than VDD. Similarly, the method includes a step 610 of chopping the input signal into a second chopped signal that substantially equals the input signal when the input signal is less than VDD and equals VDD when the input signal is greater than VDD. Finally, the method includes a step 615 of combining the first chopped signal and the second chopped signal into a combined signal by charging the combined signal to VDDX when the first chopped signal equals VDD and by grounding the combined signal when the second chopped signal equals VDD.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An input receiver, comprising:
   a waveform chopper configured to substantially pass an input signal as a first chopped signal when the input signal is greater than a threshold voltage and to clamp the first chopped signal at the threshold voltage when the input signal is less than the threshold voltage, and wherein the waveform chopper is further configured to substantially pass the input signal as a second chopped signal when the input signal is less than the threshold voltage and to clamp the second chopped signal at the threshold voltage when the input signal is greater than the threshold voltage; and
   a chopped waveform receiver including a first switch configured to switch on to charge a combined signal to a first power supply voltage when the first chopped signal is clamped at the threshold voltage and a second switch configured to switch on to ground the combined signal when the second chopped signal is clamped at the threshold voltage.

2. The input receiver of claim 1, wherein the threshold voltage is an internal power supply voltage that is approximately one-half of the first power supply voltage.

3. The input receiver of claim 2, wherein the waveform chopper further comprises:
a first pass transistor;
a second pass transistor; and
a capacitor having a first terminal and a second terminal, the capacitor configured to receive the input signal at the first terminal and to produce a bias voltage at the second terminal, wherein a gate for the first pass transistor and a gate for the second pass transistor are both coupled to the second terminal of the capacitor.

4. The input receiver of claim 3, wherein the first switch comprises a PMOS transistor having its gate driven by the first chopped signal and a source coupled to a power supply configured to supply the first power supply voltage, and wherein the second switch comprises an NMOS transistor having it gate driven by the second chopped signal and its source coupled to ground.

5. The input receiver of claim 2, wherein the chopped waveform receiver includes a first transistor configured to charge a terminal of the first switch to the internal power supply voltage in response to the combined signal being grounded.

6. The input receiver of claim 5, wherein the first transistor comprises a PMOS transistor having a source coupled to a power supply node for supplying the internal power supply voltage, a drain coupled to the terminal of the first switch, and a gate coupled to an output node carrying the combined signal.

7. The input receiver of claim 2, wherein the chopped waveform receiver includes a second transistor configured to charge a terminal of the second switch to the internal power supply voltage in response to the combined signal being charged to the first power supply voltage.

8. The input receiver of claim 7, wherein the second transistor comprises an NMOS transistor having a drain coupled to the terminal of the second switch, a source coupled to a power supply node for supplying the internal power supply voltage, and a gate coupled to an output node for carrying the combined signal.

9. The input receiver of claim 2, further comprising a step down device configured to step down the combined signal to a stepped-down signal that cycles between ground and the internal power supply voltage.

10. The input receiver of claim 9, wherein the step down device comprises an NMOS native pass transistor.

11. The input receiver of claim 10, further comprising a Schmitt trigger configured to receive the stepped-down signal and produce an output signal.

12. A method, comprising:
receiving an input signal that cycles between approximately 0 V and a first power supply voltage VDDX, VDDX being approximately twice an internal voltage supply level VDD;
chopping the received input signal into a first chopped signal that substantially equals the input signal when the input signal is greater than VDD and equals VDD when the input signal is less than VDD;
chopping the input signal into a second chopped signal that substantially equals the input signal when the input signal is less than VDD and equals VDD when the input signal is greater than VDD; and
combining the first chopped signal and the second chopped signal into a combined signal by charging the combined signal to VDDX when the first chopped signal equals VDD and by grounding the combined signal when the second chopped signal equals VDD.

13. The method of claim 12, further comprising:
stepping down the combined signal into a stepped-down signal that cycles between ground and VDD.

14. The method of claim 13, further comprising:
applying hysteresis to the stepped-down signal to provide a final output signal that also cycles between ground and VDD.

15. The method of claim 12, wherein combining the first chopped signal and the second chopped signal comprises controlling a first switch responsive to the first chopped signal and controlling a second switch responsive to the second chopped signal.

16. An input receiver, comprising:
a waveform chopper configured to substantially pass an input signal as a first chopped signal when the input signal is greater than an internal voltage supply VDD and to clamp the first chopped signal at VDD when the input signal is less than VDD, and wherein the waveform chopper is further configured to substantially pass the input signal as a second chopped signal when the input signal is less than VDD and to clamp the second chopped signal at VDD when the input signal is greater than VDD;
means for combining the first chopped signal and the second chopped signal into a combined signal that is charged to a power supply voltage VDDX when the first chopped signal equals VDD and that is grounded when the second chopped signal equals VDD, wherein VDDX is approximately twice VDD; and
a native pass transistor configured to step down the combined signal into a VDD-domain stepped-down signal.

17. The input receiver of claim 16, wherein VDDX is approximately 3.3 V and VDD is approximately 1.8 V.

18. The input receiver of claim 16, wherein the waveform chopper comprises:
a voltage divider including a capacitor, the voltage divider being configured to receive the input signal such that a bias voltage develops at a terminal of the capacitor,
a first pass transistor configured to pass the input signal as the first chopped signal, the first pass transistor having a gate controlled by the bias voltage; and
a second pass transistor configured to pass the input signal as the second chopped signal, the second pass transistor having a gate controlled by the bias voltage.

19. The input receiver of claim 18, wherein the waveform chopper further comprises:
a first clamping transistor configured to clamp the first chopped signal at VDD when the input signal is less than VDD; and
a second clamping transistor configured to clamp the second chopped signal at VDD when the input signal is greater than VDD.

20. The input receiver of claim 18, wherein the first pass transistor is a non-native PMOS transistor, and wherein the second pass transistor is a non-native NMOS transistor.

* * * * *